(12) United States Patent
Binnard et al.

(10) Patent No.: US 10,394,138 B2
(45) Date of Patent: Aug. 27, 2019

(54) SYSTEM AND METHOD FOR CONTROL OF A WORKPIECE AND A CHUCK

(71) Applicant: NIKON CORPORATION, Tokyo (JP)

(72) Inventors: Michael B. Binnard, Belmont, CA (US); Paul Derek Coon, Redwood City, CA (US)

(73) Assignee: NIKON CORPORATION (JP)

( * ) Notice: Subject to any disclaimer, the term of this patent is extended or adjusted under 35 U.S.C. 154(b) by 0 days.

(21) Appl. No.: 15/698,503

(22) Filed: Sep. 7, 2017

(65) Prior Publication Data

US 2018/0074417 A1 Mar. 15, 2018

Related U.S. Application Data

(60) Provisional application No. 62/394,717, filed on Sep. 14, 2016.

(51) Int. Cl.
*G03F 7/20* (2006.01)

(52) U.S. Cl.
CPC .......... *G03F 7/70875* (2013.01); *G03F 7/707* (2013.01)

(58) Field of Classification Search
CPC .............................. G03F 7/707; G03F 7/70875

USPC .................. 310/12.06, 12.29; 355/30, 72, 77
See application file for complete search history.

(56) References Cited

U.S. PATENT DOCUMENTS

| | | | | |
|---|---|---|---|---|
| 2003/0035088 A1* | 2/2003 | Emoto | .................... | G03F 7/707 355/53 |
| 2005/0186517 A1* | 8/2005 | Kochersperger | ........ | G03F 7/707 430/327 |
| 2012/0013865 A1* | 1/2012 | Laurent | ............... | G03F 7/70341 355/30 |
| 2018/0173116 A1* | 6/2018 | Koevoets | ............ | G03F 7/70783 |

\* cited by examiner

*Primary Examiner* — Colin W Kreutzer
(74) *Attorney, Agent, or Firm* — Roeder & Broder LLP; Steven G. Roeder

(57) ABSTRACT

An exposure apparatus (10) for transferring one or more features to a workpiece (22) includes an illumination source (44A); (ii) a chuck (40) that retains the workpiece (22); (iii) a chamber housing (28A) that encircles the chuck and the workpiece; and (iv) a temperature controller (32) (34) that adjusts the temperature of at least one of the chuck (40) and the workpiece (22) so that a predetermined temperature differential (309) exists between the chuck (40) and the workpiece (22) before transferring the features to the workpiece (22).

24 Claims, 9 Drawing Sheets

US 10,394,138 B2

SYSTEM AND METHOD FOR CONTROL OF A WORKPIECE AND A CHUCK

RELATED APPLICATION

This application claims priority on U.S. Provisional Application No. 62/394,717, entitled "SYSTEM AND METHOD FOR CONTROL OF A WORKPIECE AND A CHUCK", filed on Sep. 14, 2016. As far as permitted, the contents of U.S. Provisional Application No. 62/394,717 are incorporated herein by reference.

BACKGROUND

Lithography systems are commonly used to transfer images from a reticle onto a workpiece (e.g. a semiconductor wafer) during semiconductor processing. A typical lithography system includes a chuck that retains the workpiece during processing. Some types of lithography systems, such as Extreme Ultraviolet (EUV) or electron-beam lithography systems require operation in a vacuum.

In an EUV or electron-beam lithography system, the workpiece can initially be clamped by the chuck when the workpiece and the chuck are at atmospheric pressure. Subsequently the workpiece and chuck can be moved to a transition chamber in which the environment around the workpiece and the chuck is transitioned to a vacuum. Next, the workpiece and chuck are moved to a processing chamber where the desired features are transferred to the workpiece.

Unfortunately, the workpiece can slip relative to the chuck during the transition from atmospheric pressure to a vacuum and/or while the features are being transferred to the workpiece. This will adversely influence the alignment of the workpiece relative to the chuck and will adversely influence the quality of the features subsequently transferred to the workpiece.

SUMMARY

The present invention is directed toward an exposure apparatus for transferring one or more features to a workpiece. The exposure apparatus can include (i) a chuck that retains the workpiece that is exposed with a beam; (ii) a chamber in which the chuck is arranged; and (iii) a temperature controller that adjusts the temperature of at least one of the chuck and the workpiece so that a predetermined temperature differential (also referred to as "temperature differential") exists between the chuck and the workpiece retained by the chuck. As provided in more detail below, the problem of differential thermal expansion between the workpiece and the chuck during the exposure process is solved by pre-heating the workpiece and/or pre-chilling the chuck to achieve the predetermined temperature differential prior to exposure.

In one embodiment, the temperature controller adjusts the temperature of at least one of the chuck and the workpiece so that the predetermined temperature differential is substantially equal to an equilibrium temperature difference that will drive enough heat across a thermal contact resistance at an interface between the workpiece and the chuck. With this design, the predetermined temperature differential is sufficient so that heat flow into and out of the workpiece is substantially balanced while the features are transferred to the workpiece. As alternative, non-exclusive examples, "substantially balanced" shall mean within 0.01, 0.05, 0.1, 0.2, 0.5, 1, or 2 degree Celsius. In one specific embodiment, substantially balanced is within 0.1 degrees Celsius. In another specific embodiment, substantially balanced is within 0.05 degrees Celsius.

The temperature controller can adjust the temperature of at least one of the chuck and the workpiece so that the workpiece is hotter than the chuck. For example, the temperature controller can heat the workpiece so that a workpiece temperature is higher than a chuck temperature of the chuck.

Additionally, the exposure apparatus can include a chuck temperature controller that controls the temperature of the chuck while the features are transferred to the workpiece. Additionally, the exposure apparatus can include a heater that is secured to one of the chuck and the chuck temperature controller. With this design, the heater can be selectively controlled to compensate for variations in the illumination beam.

In another embodiment, the exposure apparatus can include (i) an illumination source that directs a variable illumination beam at the workpiece to transfer the features to the workpiece; (ii) a chuck that retains the workpiece while the features are transferred to the workpiece; (iii) a chamber housing that defines a chamber that encircles the chuck and the workpiece; (iv) a chuck temperature controller that controls the temperature of the chuck while the features are transferred to the workpiece; (v) a heater that is secured to one of the chuck and the chuck temperature controller; and (vi) a control system that controls the heater to compensate for variations in the illumination beam. Further, the chuck and the chuck temperature controller can be designed to have a known thermal resistance therebetween. With this design, the steady state temperature of the workpiece and chuck can be consistently controlled during exposure to a known value, thereby ensuring predictable thermal expansion of the workpiece and chuck.

In one example, the heater is secured to the chuck. In this example, the control system controls the heater so that a heater energy added to the chuck by the heater plus a workpiece heat energy that is transferred to the chuck from the workpiece during exposure is approximately equal to a chuck heat energy that is transferred from the chuck to the chuck temperature controller.

In an alternative example, the heater is secured to the chuck temperature controller. In this example, the control system controls the heater so that a heater energy added to the chuck temperature controller by the heater plus a chuck heat energy that is transferred from the chuck to the chuck temperature controller is approximately constant despite changes in the workpiece heat energy from the illumination beam during exposure.

In another embodiment, the present invention is directed to a chamber assembly for transiting a workpiece having a workpiece bulk modulus from a first controlled environment to a second controlled environment that is at a different pressure from the first controlled environment. In this embodiment, the chamber assembly includes (i) a chuck that retains the workpiece, the chuck having a chuck bulk modulus that is different than the workpiece bulk modulus; (ii) a transition chamber assembly that defines a transition chamber that encircles the workpiece and the chuck; (iii) a transition environmental controller that is in fluid communication with the transition chamber, the transition environmental controller being adapted to selectively move the transition chamber from the first controlled environment to the second controlled environment; and (iv) a temperature controller that adjusts the temperature of one of the chuck and the workpiece to compensate for the differential expansion of the workpiece and the chuck during the transition from the first controlled environment to the second controlled environment. With this design, the problem of differential expansion between the workpiece and the chuck during a change in ambient pressure (e.g., a transition from atmospheric pressure to vacuum) is solved by simultaneously controlling the workpiece temperature and/or the chuck temperature so thermal expansion/contraction of the workpiece and chuck offsets the difference in the bulk moduli of the workpiece and chuck materials.

In one embodiment, (i) the workpiece bulk modulus is less than the chuck bulk modulus; (ii) the first controlled environment is at a higher pressure than the second controlled environment so that the workpiece has a workpiece pressure expansion and the chuck has a chuck pressure expansion caused by the transition from the first controlled environment to the second controlled environment, the workpiece pressure expansion being greater than the chuck pressure expansion; and (iii) the temperature controller cools the workpiece to compensate for the workpiece pressure expansion being greater than the chuck pressure expansion. For example, the temperature controller can cool the workpiece so that a workpiece thermal contraction of the workpiece plus the workpiece pressure expansion is approximately equal to the chuck pressure expansion. As alternative, non-exclusive examples, "approximately equal" shall mean less than 0.1, 0.2, 0.5, 1, or 2 parts per million.

Alternatively, or additionally, the temperature controller can heat the chuck to compensate for the workpiece pressure expansion being greater than the chuck pressure expansion. For example, the temperature controller can heat the chuck so that a chuck thermal contraction of the chuck plus the chuck pressure expansion is approximately equal to the workpiece pressure expansion. As alternative, non-exclusive examples, "approximately equal" shall mean less than 0.1, 0.2, 0.5, 1, or 2 parts per million.

The present invention is also directed one or more methods for transferring features of to the workpiece; one or more methods for transiting a workpiece from a first controlled environment to a second controlled environment; to a semiconductor workpiece; and a method for making a semiconductor workpiece.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
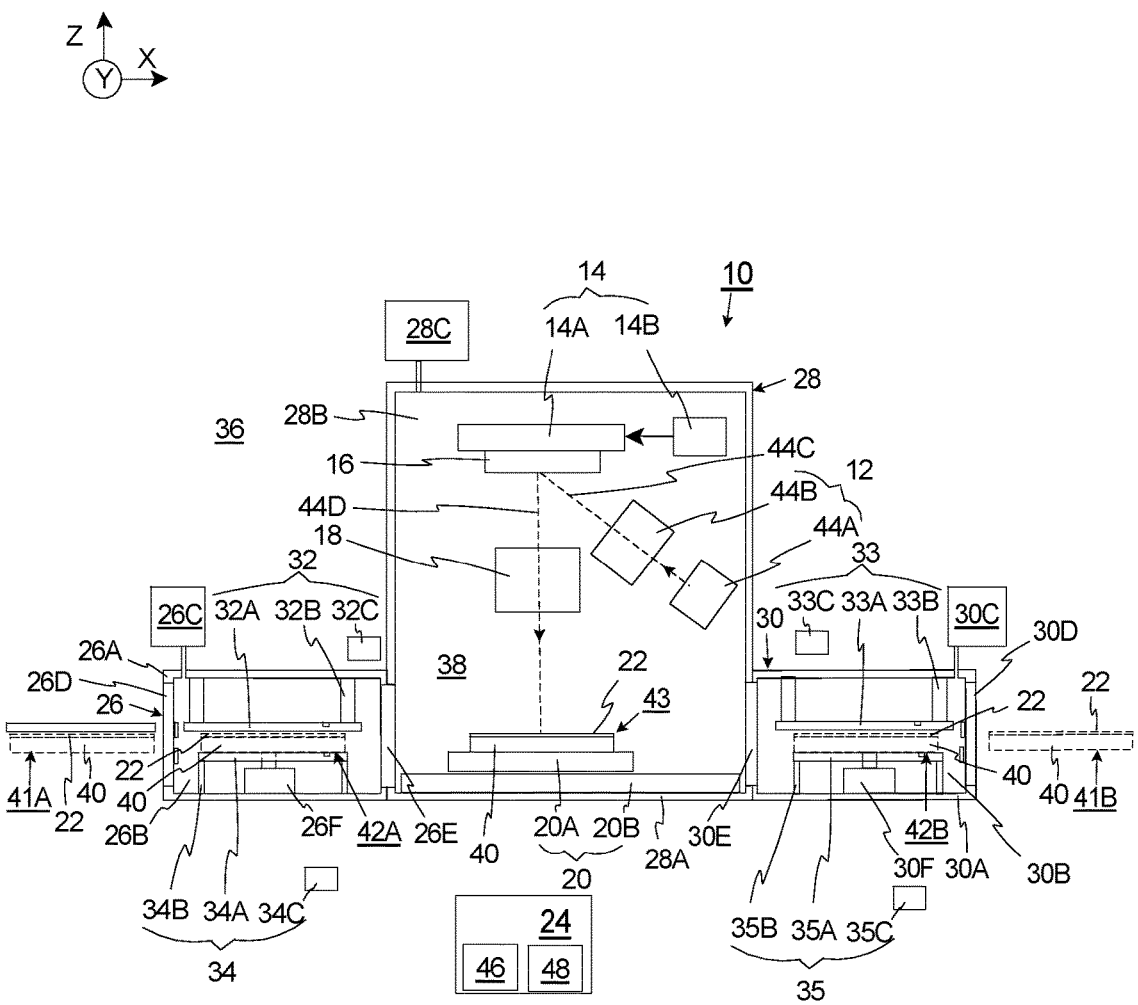
FIG. 1 is a simplified schematic illustration, in partial cut-away, of a lithography system having features of the present invention.

FIG. 1 is a simplified, non-exclusive, schematic view illustrating a lithography system 10 ("exposure apparatus") that includes an illumination system 12 (irradiation apparatus), a mask stage assembly 14 that retains a mask 16, a projection optical assembly 18, a workpiece table assembly 20 that retains and positions a workpiece 22, a control system 24, a first transition chamber assembly 26 (also referred to as a "first load lock"), a processing chamber assembly 28, and a second transition chamber assembly 30 (also referred to as a "second load lock"). It should be noted that the lithography system 10 can be designed with more or fewer components than are illustrated in FIG. 1. For example, the lithography system 10 can be an e-beam direct write system in which there is no mask 16, no mask stage assembly 14 or anything that acts like a mask 16.

The type of workpiece 22 can be varied. For example, the workpiece 22 can be a semiconductor wafer.

As an overview, a number of alternative embodiments are provided herein. In one embodiment, the lithography system 10 includes one or more temperature controllers that adjust the temperature of the workpiece 22 and/or a chuck 40 that retains the workpiece 22 so that a predetermined temperature differential exists between the chuck 40 and the workpiece 22 before transferring the features to the workpiece 22 in the processing chamber assembly 28.

More specifically, in one embodiment, the workpiece 22 is clamped by the chuck 40 in the atmosphere outside the chamber assemblies 26, 28, 30. Next, the workpiece 22 and chuck 40 are moved into the first transition chamber 26 where a vacuum is created around the workpiece 22 and the chuck 40. Subsequently, the workpiece 22 and the chuck 40 are moved into the vacuum processing chamber assembly 28 where the workpiece 22 is exposed using a pattern irradiation beam 44D (described below) (e.g., EUV light or an electron beam). During exposure, the energy of the pattern beam 44D is absorbed by the workpiece 22, causing it to heat up. In the vacuum environment, thermal contact between the workpiece 22 and the chuck 40 is relatively poor, so a temperature difference develops between the workpiece 22 and the chuck 40. This causes differential thermal expansion between the workpiece 22 and the chuck 40, which can lead to slippage of the workpiece 22 and degradation of the overlay performance of the lithography system 10.

In one embodiment of the present invention, a steady-state, equilibrium temperature difference between the workpiece 22 and the chuck 40 is determined ahead of time, either by experiment, simulation, or measurement of the temperature difference in a prior exposure. The equilibrium temperature difference is the temperature difference that will drive enough heat across the thermal contact resistance of the interface of the workpiece 22 and the chuck 40 to balance the incoming exposure power from the pattern beam 44D. As provided herein, if the workpiece 22 is pre-heated and/or the chuck 40 is chilled so that the predetermined temperature differential is approximately equal to the equilibrium temperature difference, then during exposure, the heat flow into and out of the workpiece 22 is balanced.

Thus, as provided herein, the problem of differential thermal expansion between the workpiece 22 and the chuck 40 during the exposure process is solved by pre-heating the workpiece 22 and/or pre-chilling the chuck 40 to achieve the predetermined temperature differential prior to exposure. As non-exclusive examples, the pre-heating of the workpiece 22 and/or the pre-chilling of the chuck 40 to achieve the predetermined temperature differential can be done at one or more of the following locations: (i) before the workpiece 22 is positioned on the chuck 40 outside the chamber assemblies 26, 28, 30; (ii) after the workpiece 22 is positioned on the chuck 40 outside the chamber assemblies 26, 28, 30; (iii) with the workpiece 22 positioned on the chuck 40 inside the first transition chamber assembly 26 before the vacuum is created in the first transition chamber assembly 26; (iv) with the workpiece 22 positioned on the chuck 40 inside the first transition chamber assembly 26 while the vacuum is being created in the first transition chamber assembly 26; (vi) with the workpiece 22 positioned on the chuck 40 inside the first transition chamber assembly 26 after the vacuum is created in the first transition chamber assembly 26; and/or (vii) with the workpiece 22 positioned on the chuck 40 inside the processing chamber assembly 28 just prior to transferring the features to the workpiece 22.

Thus, the predetermined temperature differential can be created: (i) before chucking outside the chamber assemblies 26, 28, 30; (ii) after chucking outside the chamber assemblies 26, 28, 30; (iii) inside the first transition chamber assembly 26 before, during, and/or after the vacuum transition; and/or (iv) inside the processing chamber assembly 28 prior to transferring the features to the workpiece 22.

It should be noted that regardless of when the predetermined temperature differential is created, it must be maintained until the start of the exposure. In alternative, non-exclusive embodiments, the temperature control system 32 is designed and operated so that the predetermined temperature differential still exists within at least 10, 5, or 1 second before the start of exposure. With this design, the temperature control system 32 is controlled and operated so that the predetermined temperature differential is created before exposure and still exists at the start of exposure. In certain embodiments, the temperature control system 32 can be designed to also control the temperature in the second transition chamber assembly 30 to the same level.

For example, the lithography system 10 can include a first temperature controller 32 that preheats the workpiece 22 in the first transition chamber 26 to create the predetermined temperature differential between the workpiece 22 and the chuck 40. Additionally, or alternatively, the lithography system 10 can include a second temperature controller 34 that chills the chuck 40 in the first transition chamber 26 to create the predetermined temperature differential between the workpiece 22 and the chuck 40.

The first transition chamber 26 is used to change the environment around the workpiece 22 from a first controlled environment 36 (e.g. atmospheric pressure) to a second controlled environment 38 (e.g. a vacuum).

As used herein, the term "atmospheric pressure" shall mean the pressure exerted by the weight of air in the atmosphere of Earth. Further, as used herein, the term "vacuum" shall mean any space in which the pressure is significantly lower than atmospheric pressure. In one embodiment, pressure in the range of approximately 1 torr to 1e-3 torr is considered a "medium vacuum". Further, pressure in the range of approximately 1e-3 torr to 1e-8 torr is considered a "high vacuum". Additionally, pressure below 1e-8 torr is considered an "ultra-high vacuum".

Some of the Figures provided herein include an orientation system that designates the X axis, the Y axis, and a Z axis that are orthogonal to each other. In these Figures, the Z axis is oriented in the vertical direction. It should be understood that the orientation system is merely for reference and can be varied. For example, the X axis can be switched with the Y axis and/or the lithography system 10 can be rotated. Moreover, these axes can alternatively be referred to as a first, a second, or a third axis. For example, the X axis can be referred to as the first axis, the Y axis can be referred to as the second axis, and the Z axis can be referred to as the third axis.

The design, and location of these components of the lithography system 10 can be varied pursuant to the teachings provided herein. It should be noted that the lithography system 10 will typically include more components than illustrated in FIG. 1. For example, the lithography system 10 can include a rigid apparatus frame (not shown) for retaining one or more of the components of the system. Moreover, the lithography system 10 can include one or more temperature control systems (not shown) that control the temperature of one or more of the components of the lithography system 10. For example, the illumination system 12, the mask stage assembly 14, the projection optical assembly 18, and/or the workpiece stage assembly 20 can require cooling with a temperature control system.

Further, one or more of the components for lithography system 10 in FIG. 1 can be optional. For example, the lithography system 10 could be designed to include a single transition chamber assembly 26, 28. Alternatively, the lithography system 10 can be designed without the transition chamber assemblies 26, 28. In this embodiment, the environmental transitions would occur in the processing chamber assembly 28 and a temperature controller can be added to the processing chamber assembly 28.

It should be noted that the workpiece 22 and the chuck 40 are illustrated in five alternative positions in FIG. 1. Moving left to right in FIG. 1, the workpiece 22 and the chuck 40 are illustrated (i) in a first outside position 41A (in phantom) on the left, outside the chamber assemblies 26, 28, 30; (ii) in a first transition position 42A (in phantom) in the first transition chamber assembly 26; (iii) in a processing position 43 in the processing chamber assembly 28; (iv) in a second transition position 42B (in phantom) in the second transition chamber assembly 30; and (v) in a second outside position 41B (in phantom) on the right, outside the chamber assemblies 26, 28, 30.

The illumination system 12 includes an illumination source 44A and an illumination optical assembly 44B. The illumination source 44A emits an illumination beam 44C and the illumination optical assembly 44B conditions and directs the illumination beam 44C at the mask 16.

In one, non-exclusive embodiment, the illumination source 44A is an extreme ultra-violet ("EUV") system and the illumination beam 44C is in the EUV spectral range. For example, the EUV radiation can have a wavelength of 13.5 nm or shorter. Alternatively, the illumination source 44A can be designed so that the illumination source 44A is an electron beam source that generates an electron beam.

For example, the illumination optical assembly 44B can be reflective, and include one or more optical elements (not shown) that are operable in the EUV spectral range. More specifically, each optical element includes a working surface that is coated to reflect light in the EUV spectral range. In other example embodiments using an electron-beam, the illumination optical assembly 44B can consist of electrostatic or electromagnetic lenses for controlling the illumination beam 44C.

The mask stage assembly 14 retains the mask 16. In one embodiment, the mask stage assembly 14 moves and positions the mask 16. For example, the mask stage assembly 14 can include a mask stage 14A that retains the mask 16, and a mask mover assembly 14B that moves and positions the mask stage 14A and the mask 16. For example, the mask mover assembly 14B can include one or more actuators that move the mask stage 14A with one or more degrees of freedom.

In the embodiment illustrated in FIG. 1, the mask 16 reflects the illumination beam 44C to create a pattern illumination beam 44D that is directed at the workpiece 22 via the projection optical assembly 18. In one embodiment, the mask 16 includes a structure that alters the phase and/or the intensity of the illumination beam 38. For example, the structure may be a pattern of reflective and non-reflective features. Alternatively, for example, the mask 16 can be a digital mask. In other embodiments the mask 16 can be used in a transmissive manner, wherein the illumination beam 44C passes through the mask 16 and forms the pattern beam 44D.

The projection optical assembly 18 directs the pattern beam 44D onto a light-sensitive photoresist material formed on the workpiece 22 positioned at an image plane of the projection optical assembly 18. In one embodiment, the projection optical assembly 18 is reflective and includes one or more optical elements. In other embodiments, the projection optical assembly 18 includes one or more electrostatic or electromagnetic lenses.

The workpiece stage assembly 20 holds the workpiece 22 and the chuck 40, and positions and moves the workpiece 22 and the chuck 40 relative to the pattern beam 44D. As one non-exclusive example, the workpiece stage assembly 20 can include the workpiece table 20A that selectively retains the chuck 40, and a workpiece mover assembly 20B that is controlled to selectively move and position the workpiece table 20A, the chuck 40, and the workpiece 22 relative to the pattern beam 44D and the rest of the lithography system 10. For example, the workpiece mover assembly 20B can move and position these components with six degrees of freedom, e.g. along the X, Y, and Z axes and about the X, Y, and Z axes. Alternatively, the workpiece mover assembly 20B can be designed to move these components with less than six degrees of freedom, e.g. with three degrees of freedom. As provided herein, the workpiece mover assembly 20B can include one or more planar motors, linear motors, voice coil motors, attraction only actuators, pneumatic or hydraulic actuators, and/or other types of actuators.

The first transition chamber assembly 26 is used to transition the workpiece 22 from the first controlled environment 36 to the second controlled environment 38. In one embodiment, the first transition chamber assembly 26 includes a first transition chamber housing 26A (illustrated in cut-away) that defines an enclosed, first transition chamber 26B, the first temperature controller 32, and a first transition environmental controller 26C that controls the environment in the first transition chamber 26B. The design of each of these components can be varied to suit the design requirements of the lithography system 10.

In one embodiment, the first transition chamber housing 26A is generally rigid and forms a generally rectangular shaped, sealed, first transition chamber 26B. Additionally, the first transition chamber housing 26A can include a first door 26D that can be selectively opened to expose the first transition chamber 26B to the first controlled environment 36, and a second door 26E that can be selectively opened to expose the first transition chamber 26B to the second controlled environment 38.

With this design, the first door 26D can be opened (and the second door 26E closed) to allow for the movement of the workpiece 22 and the chuck 40 from the outside into the first transition chamber 26B. Next, with the doors 26D, 26E closed, the first transition environmental controller 26C can be controlled (pull a vacuum) to change the environment in the first transition chamber 26B from the first controlled environment 36 to the second controlled environment 38. Subsequently, the second door 26E can be opened (while the first door 26D is closed) to allow for the movement of the workpiece 22 and the chuck 40 from inside the first transition chamber 26B to inside the processing chamber assembly 28. With this design, the workpiece 22 and the chuck 40 can be moved from the first controlled environment 36 to inside the processing chamber assembly 28 without influencing the second controlled environment 38 in the processing chamber assembly 28. Thus, the purpose of the first transition chamber assembly 26 is to make sure that the high vacuum in processing chamber assembly 28 is undisturbed (or less disturbed).

As non-exclusive examples, the first transition environmental controller 26C can include one or more vacuum pumps or fluid pumps.

Additionally, the first transition chamber assembly 26 can include a first workpiece mover 26F (illustrated as two boxes) that can be controlled (i) to move the workpiece 22 and the chuck 40 from outside the first transition chamber 26B to inside the first transition chamber 26B, and (ii) to move the workpiece 22 and the chuck 40 from inside the first transition chamber 26B to inside the processing chamber assembly 28. For example, the first workpiece mover 26F can be a robotic arm that engages the chuck 40 and that is controlled to precisely position the workpiece 22 and the chuck 40. Alternatively, the robotic arm can be located outside the first transition chamber assembly 26.

In one embodiment, the first temperature controller 32 can include a first thermal structure 32A that is positioned in the first transition chamber 26B near the workpiece 22. Optionally, the first temperature controller 32 can include a first structure mover 32B that selectively moves the first thermal structure 32A, and a first structure temperature controller 32C that can control the temperature of the first thermal structure 32A. With this design the first temperature controller 32 can be used to adjust the temperature of the workpiece 22 and create the temperature differential between the chuck 40 and the workpiece 22 before exposure.

Similarly, in one embodiment, the second temperature controller 34 can include a second thermal structure 34A that is positioned in the first transition chamber 26B near the chuck 40. Optionally, the second temperature controller 34 can include a second structure mover 34B that selectively moves the second thermal structure 34A, and a second structure temperature controller 34C that can control the temperature of the second thermal structure 34A.

The processing chamber assembly 28 encircles and encloses one or more of the components of the lithography system 10, and provides the second controlled environment 30 for these components. In one embodiment, the processing chamber assembly 28 includes a processing chamber housing 28A (illustrated in cut-away) that defines an enclosed, processing chamber 28B, and a processing environmental controller 28C that controls the environment in the processing chamber 28B. The design of each of these components can be varied to suit the design requirements of the lithography system 10.

In one embodiment, the processing chamber housing 28A is generally rigid and forms a generally rectangular shaped, sealed, processing chamber 28B. As non-exclusive examples, the processing environmental controller 28C can include one or more vacuum pumps or fluid pumps to control the second controlled environment to be a vacuum.

The second transition chamber assembly 30 is used to transition the workpiece 22 from the second controlled environment 38 to the first controlled environment 36. In one embodiment, the second transition chamber assembly 30 includes a second transition chamber housing 30A (illustrated in cut-away) that defines an enclosed, second transition chamber 30B, and a second transition environmental controller 30C that controls the environment in the second transition chamber 30B. The design of each of these components can be varied to suit the design requirements of the lithography system 10.

In one embodiment, the second transition chamber housing 30A is generally rigid and forms a generally rectangular shaped, sealed, second transition chamber 30B. Additionally, the second transition chamber housing 30A can include a first door 30D that can be selectively opened to expose the second transition chamber 30B to the first controlled environment 36, and a second door 30E that can be selectively opened to expose the second transition chamber 30B to the second controlled environment 38.

With this design, with the doors 30D, 30E closed, the second transition environmental controller 30C can be controlled to change the environment in the second transition chamber 30B from the first controlled environment 36 to the second controlled environment 38. Subsequently, the second door 30E can be opened (while the first door 30D is closed) to allow for the movement of the workpiece 22 and the chuck 40 from inside the processing chamber assembly 28 to the second transition chamber 30B. Next, the second door 30E can be closed and the second transition environmental controller 30C can be controlled to change the environment in the second transition chamber 30B from the second controlled environment 38 to the first controlled environment 36. Finally, the first door 30D can be opened (while the second door 30E is closed) to allow for the movement of the workpiece 22 and the chuck 40 from the second transition chamber 30B to the outside. With this design, the workpiece 22 and the chuck 40 can be moved from inside the processing chamber assembly 28 to the outside without influencing the second controlled environment 38 in the processing chamber assembly 28.

As non-exclusive examples, the second transition environmental controller 30C can include one or more vacuum pumps or fluid pumps.

Additionally, the second transition chamber assembly 30 can include a second workpiece mover 30F (illustrated as two boxes) that can be controlled (i) to move the workpiece 22 and the chuck 40 from inside the processing chamber assembly 28 to the second transition chamber 30B; and (ii) to move the workpiece 22 and the chuck 40 from inside the second transition chamber 30B to the outside. For example, the second workpiece mover 30F can be a robotic arm that engages the chuck 40 and that is controlled to precisely position the workpiece 22 and the chuck 40. Alternatively, the robotic arm can be located outside the second transition chamber assembly 30.

In one embodiment, the second transition chamber assembly 30 is somewhat similar in design to the first transition chamber assembly 26. In this embodiment, the second transition chamber assembly 30 includes a second, first temperature controller 33 that is similar to the first temperature controller 32. In this design, the second, first temperature controller 33 can also include (i) a second, first thermal structure 33A that is similar to the first thermal structure 32A, (ii) a second, first structure mover 33B that is similar to the first structure mover 32B, and (iii) a second, first structure temperature controller 33C that is similar to the first structure temperature controller 32C. Further, the second transition chamber assembly 30 includes a second, second temperature controller 35 that is similar to the second temperature controller 34. In this design, the second, second temperature controller 35 can also include (i) a second, second thermal structure 35A that is similar to the second thermal structure 34A, (ii) a second, second structure mover 35B that is similar to the second structure mover 34B, and (iii) a second, second structure temperature controller 35C that is similar to the second structure temperature controller 34C.

The control system 24 is electrically connected and controls (i) electrical current to the mask mover assembly 14B to control the position of the mask 16; (ii) electrical current to the workpiece stage assembly 20 to control the position of the workpiece 22; (iii) the illumination system 12 to control the illumination beam 44C; and (iv) the chuck 40 to selectively retain the workpiece 22. Additionally, the control system 24 can be electrically connected to and control (i) the environmental controllers 26C, 28C, 30C; (ii) the workpiece movers 26F, 30F; (iii) the structure movers 32B, 34B; and (iv) the temperature controllers 32, 34.

The control system 24 can include one or more processors 46, and one or more electronic data storage devices 48. In FIG. 1, the control system 24 is illustrated as a single control system 24. Alternatively, one or more of the functions of the control system 24 can be distributed to different processors or control systems.

Figure 2:
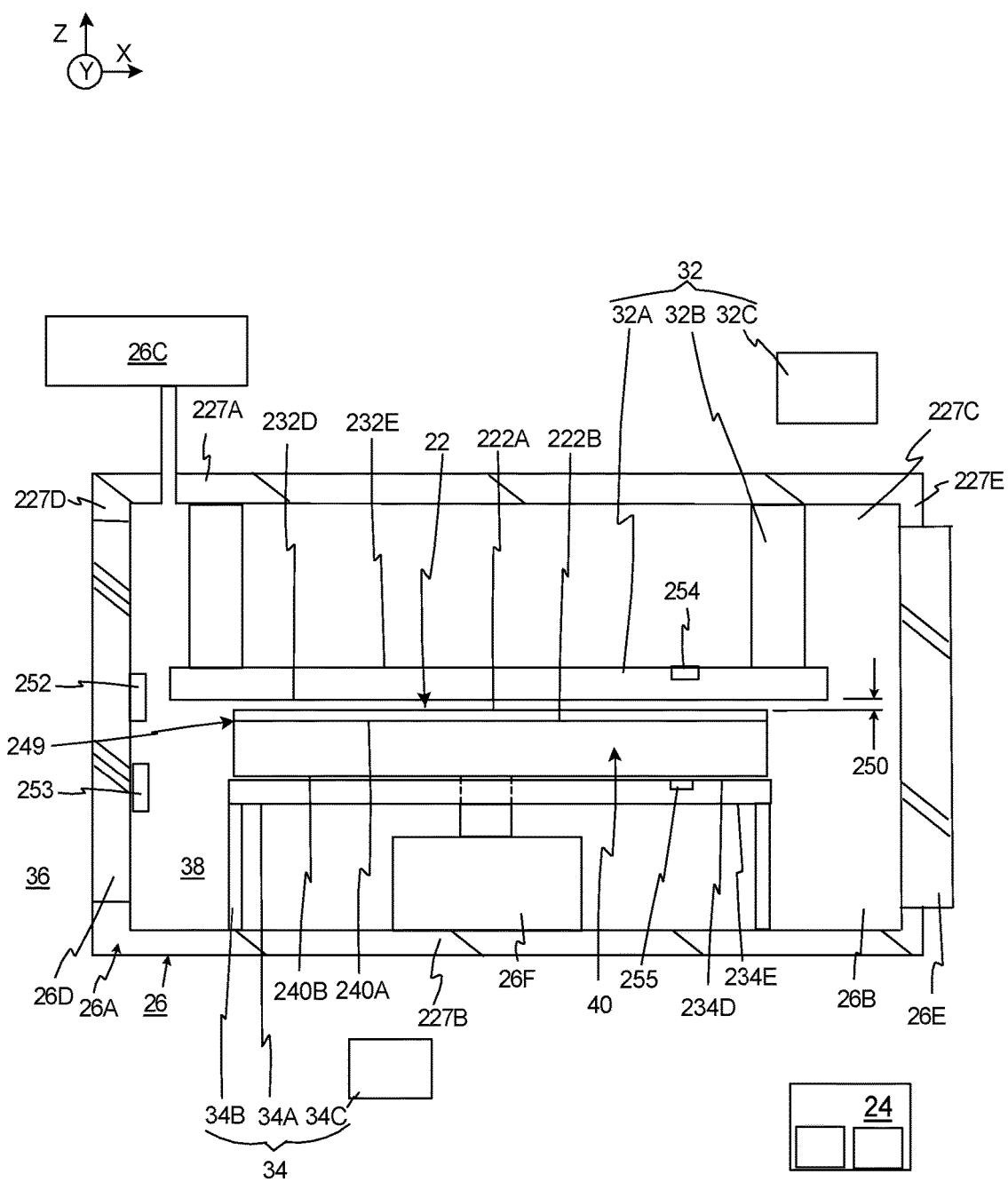
FIG. 2 is a simplified schematic illustration of a portion of the lithography system of FIG. 1.

FIG. 2 is a simplified illustration of the first transition chamber assembly 26 with the chuck 40 retaining the workpiece 22 within the first transition chamber 26B. In one embodiment, the workpiece 22 is disk shaped and includes an upper, workpiece exposed surface 222A and an opposed, lower, chucked surface 222B. For example, the workpiece 22 can be a semiconductor wafer with the features being subsequently transferred to the workpiece exposed surface 222A, and the chucked surface 222B is chucked by and engages at least a portion of the chuck 40. It should be noted that the second transition chamber assembly 30 (illustrated in FIG. 1 can have a similar design.

The design of the chuck 40 can vary. For example, the chuck 40 can be generally disk shaped and include an upper, chucking surface 240A that engages at least a portion of the chucked surface 222B, and an opposed, lower chuck surface 240B. In one embodiment, the chucked surface 222B and the lower chuck surface 240B are generally planar shaped. Alternatively, the upper, chucking surface 240A can include a plurality of spaced apart projections (not shown) to form a pin chuck that engages the chucked surface 222B. In one embodiment, the chuck 40 can be an electrostatic chuck, and the chuck 40 can be made of a dielectric having a certain (volumetric) conductivity. With this design, the control system 24 can direct current to the chuck 40 to generate an electrostatic force that urges the workpiece 22 against the chuck 40.

In certain embodiments, to minimize unpredictable deformations, the chuck 40 should be made of a material having a high thermal conductivity, low coefficient of thermal expansion, and high stiffness. One, non-exclusive example of a suitable material for the chuck 40 is Silicone Carbide ("SiC").

It should be noted that the workpiece 22 positioned against the chuck 40 forms an interface 249 that provides (i) a conductive thermal path at the points where the chuck 40 engages the workpiece 22; and (ii) a radiation thermal path at the areas where the chucked surface 222B is spaced apart from the chucking surface 240A. Thus, the heat transfer between the workpiece 22 and the chuck 40 is a combination of radiation heat transfer and conduction heat transfer. Typically, the heat transfer between the workpiece 22 and the chuck 40 is substantially higher at atmospheric pressure than in a vacuum. Stated in another fashion, the conduction path is good when at atmosphere and bad when in a vacuum. The radiation heat path does not change.

As provided above, the first transition chamber assembly 26 is used to transition the workpiece 22 from the first controlled environment 36 (e.g. atmospheric pressure) to the second controlled environment 38 (e.g. a vacuum). Further, the first transition chamber assembly 26 includes the first transition chamber housing 26A (illustrated in cut-away) that defines the enclosed, first transition chamber 26B, the first temperature controller 32, and the first transition environmental controller 26C that controls the environment in the first transition chamber 26B.

In one embodiment, the first transition chamber housing 26A is generally rigid and forms the generally rectangular box shaped, sealed, first transition chamber 26B. In this embodiment, the first transition chamber housing 26A includes (i) a top wall 227A, (ii) a bottom wall 227B that is parallel to and spaced apart from top wall 227A, (iii) a front wall (not shown), (iv) a back wall 227C that is parallel to and spaced apart from front wall, (v) a left side wall 227D, and (vi) a right side wall 227E that is parallel to and spaced apart from left side wall 227D. In this embodiment, each of the walls 227A, 227B, 227C, 227D, 227E is planar shaped, and the front, back and side walls 227C, 227D, 227E extend between the top wall 227A and the bottom wall 227B. Additionally, the first door 26D is positioned in the left side wall 227D, and the second door 26E is positioned in the right side wall 227E.

The first temperature controller 32 adjusts the temperature of the workpiece 22 and/or the second temperature controller 34 adjusts the temperature of the chuck 40 to achieve the predetermined temperature differential before exposure of the workpiece 22.

Figure 3:
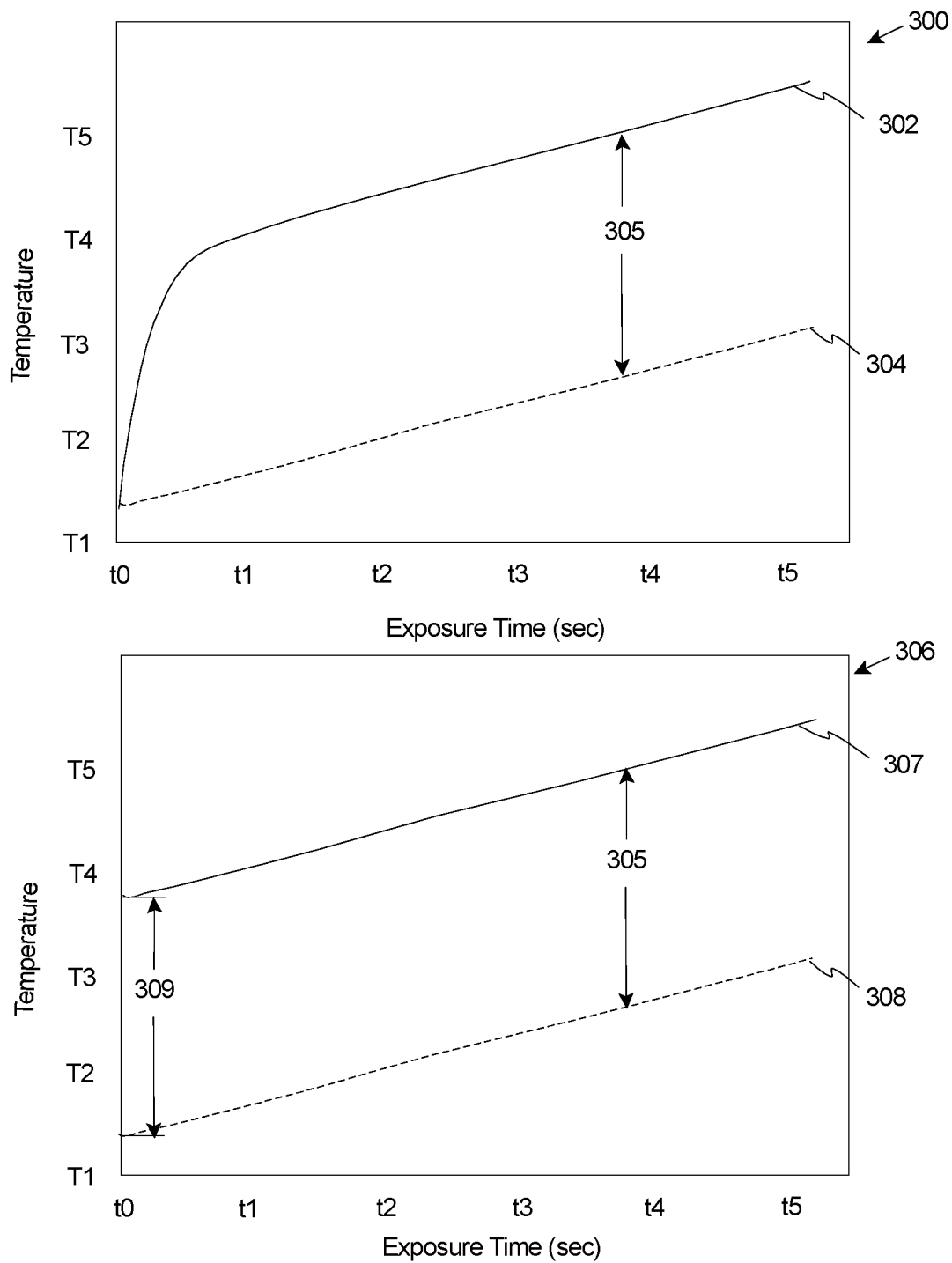
FIG. 3 includes alternative graphs that illustrate workpiece temperature and chuck temperature versus time.

FIG. 3 includes an upper graph 300 that illustrates (i) a first curve 302 that illustrates how a workpiece temperature of the workpiece changes during an exposure process, and (ii) a second curve 304 that illustrates how a chuck temperature of the chuck changes during an exposure process without the predetermined, temperature differential being created prior to exposure. During exposure, the exposure energy is absorbed by the workpiece, causing it to heat up. In the vacuum environment, thermal contact between the workpiece and chuck is relatively poor, so a temperature differential quickly develops between the workpiece and the chuck. Because the predetermined, temperature differential was not created prior to exposure in this example, when exposure begins, the workpiece temperature 302 rapidly raises relative to the chuck temperature 304 (e.g. during t0 to approximately t1 of exposure). The differential thermal expansion of the workpiece relative to the chuck can lead to workpiece slip which degrades the overlay performance of the exposure machine. Subsequently, during the rest of the exposure (e.g. during time t1-t5 seconds of exposure) the workpiece temperature 302 and the chuck temperature 304 rise at approximately the same rate.

Stated in another fashion, during the start of exposure, the slope of the workpiece temperature change is much greater than the slope of the chuck temperature change. Subsequently, during the rest of the exposure, the slope of the workpiece temperature change is approximately equal to the slope of the chuck temperature change.

As illustrated in graph 300, after the beginning portion of the exposure, a steady-state temperature difference 305 between the workpiece and the chuck is reached during the rest of the exposure. At this time, the workpiece temperature and the chuck temperature rise at approximately the same rate. As provided herein, this steady-state (equilibrium) temperature difference 305 is equal to the temperature difference (delta-T) that will drive enough heat across the thermal contact resistance of the workpiece/chuck interface 249 (illustrated in FIG. 2). The steady-state temperature difference 305 is achieved when the heat flow into and out of the workpiece is approximately balanced. The magnitude of the steady-state temperature difference 305 will vary according to the amount of heat transfer that occurs at the interface 249 during the exposure and the thermal contact resistance of the interface 249 and the amount of heat that is transferred to the workpiece from the beam. In alternative, non-exclusive embodiments, the predetermined, steady-state temperature difference 305 can be at least 0.01, 0.03, 0.05, 0.1, 0.5, 1, 2, degrees Celsius or greater. The steady state temperature difference is caused by the exposure heat from the exposure system and the heat transfer coefficient between the work piece and the chuck. The steady-state temperature difference 305 can be determined experimentally ahead of time, by measuring the temperature difference 305 in a prior exposure operation, through computer simulation, or through theoretical calculation.

FIG. 3 also includes an lower graph 306 that illustrates a first curve 307 that illustrates how a workpiece temperature of the workpiece changes during an exposure process, and a second curve 308 that illustrates how a chuck temperature of the chuck changes during an exposure process when the predetermined, temperature differential 309 has been created prior to exposure. In this design, the temperature controller can be used to adjust the temperature of the workpiece and/or the chuck to create the temperature differential between the chuck and the workpiece before and at the start of exposure. Because the predetermined, temperature differential 309 was created prior to exposure, the workpiece temperature 307 rises at approximately the same rate as the chuck temperature 308 during the entire exposure. Stated in another fashion, as a result of the predetermined temperature differential 309, the slope of the workpiece temperature change is substantially equal (within approximately 1, 2, 5, or 10 percent in alternative embodiments) to the slope of the chuck temperature change during the entire exposure. With this design, the chuck temperature 308 is maintained lower than the workpiece temperature 307. In certain embodiments, the predetermined temperature differential 309 just before exposure is approximately equal (within approximately 1, 2, 5, or 10 percent in alternative embodiments) to the steady-state temperature difference 305. As alternative, non-exclusive examples, the temperature controller is controlled so that the predetermined temperature differential 309 is within 0.01, 0.05, 0.1, 0.2, 0.5, or 1 degree Celsius of the steady-state temperature difference 305.

With this design, the position and orientation of alignment marks (not shown) on the workpiece can be measured at the beginning of the exposure process after the predetermined temperature differential 309 is achieved. Subsequently, during exposure, the workpiece temperature 307 rises at approximately the same rate as the chuck temperature 308. This will reduce the likelihood of workpiece slippage, and reduce the amount of workpiece deformation. By maintaining the workpiece 22 and the chuck 40 with a fixed temperature difference between them, overlay performance can be improved. Stated in another fashion, establishing the correct temperatures of the workpiece 22 and the chuck 40 prior to exposure ensures that the workpiece 22 will be in a consistent state before the initial alignment measurement, and that the workpiece 22 will not expand or distort unpredictably during exposure.

The magnitude of the predetermined temperature differential 309 will vary according to the amount of heat transfer that occurs at the interface 249 during the exposure. As provided herein, the predetermined temperature differential 309 is preferably equal to the steady-state temperature difference 305. For example, the predetermined temperature differential 309 can be within approximately 90 percent or more of the steady-state temperature difference 305. In alternative, non-exclusive embodiments, the predetermined, temperature differential can be at least 0.01, 0.03, 0.05, 0.1, 0.5, 1, 2, degrees Celsius or greater. Stated in another fashion, in alternative, non-exclusive embodiments, the predetermined temperature differential can be at least approximately 3, 4, 5, 6, or 10 milli-Kelvin.

Referring back to FIG. 2, (i) the first temperature controller 32 heats the workpiece 22 to raise the workpiece temperature; and/or (ii) the second temperature controller 34 cools the chuck 40 to lower the chuck temperature to achieve the predetermined temperature differential 309 (illustrated in FIG. 3) that exists immediately prior to exposure of the workpiece 22. Thus, the temperature controller 34, 36 adjusts the temperature of at least one of the chuck 40 and the workpiece 22 so that the predetermined temperature differential 309 is sufficient so that heat flow into and out of the workpiece approximately balance during exposure.

As provided above, the first temperature controller 32 can include the first thermal structure 32A that is sized, shaped and positioned to control the workpiece temperature of the workpiece 22 (and the workpiece exposed surface 222A). In one embodiment, the first thermal structure 32A is a disk shaped, is made of a material having a relatively good thermal conductivity, and includes a structure adjacent surface 232D and a structure opposed surface 232E that is opposite to the structure adjacent surface 232D. In this embodiment, the structure adjacent surface 232D is positioned adjacent to, completely covers, and faces the workpiece exposed surface 222A. Further, the structure adjacent surface 232D is positioned in close proximity to and spaced apart by a structure separation distance 250 from the workpiece exposed surface 222A. In certain, non-exclusive examples, the structure separation distance 250 is less than fifteen (15), fourteen (14), thirteen (13), twelve (12), eleven (11), ten (10), nine (9), eight (8), seven (7), six (6), five (5), one (1), one-half (0.5) millimeters. Generally, the performance improves as the separation distance is decreased. In certain embodiments, it is important that the workpiece exposed surface 222A does not touch the first thermal structure 32A because that can damage the workpiece exposed surface 222A.

As proved above, optionally, the first temperature controller 32 can include the first structure mover 32B that selectively moves the first thermal structure 32A relative to the workpiece 22 to selectively adjust and tune the structure separation distance 250 and/or to move the first thermal structure 32A out of the way when the workpiece 22 is being moved in or out of the first transition chamber 26B. For example, the first structure mover 32B can include one or more actuators that move the first thermal structure 32A along the X, Y and Z axes relative to the workpiece 22 so that the first thermal structure 32A is positioned directly above the workpiece 22. Additionally, the first structure mover 32B can include a position sensor 252 that monitors the position of the first thermal structure 32A and/or the workpiece 22 for closed loop control of the first structure mover 32B.

Additionally or alternatively, the first workpiece mover 26F can be used to adjust the structure separation distance 250 and the relative position between the workpiece 22 and the first thermal structure 32A.

Further, as provided above, the first temperature controller 32 can include the first structure temperature controller 32C that can control the temperature of the first thermal structure 32A. As a non-exclusive example, the first structure temperature controller 32C can direct and circulate a fluid through the first thermal structure 32A to obtain the predetermined, temperature differential between the workpiece 22 and the chuck 40. The first structure temperature controller 32C can include one or more reservoirs, pumps, coolers, heaters, and/or flow valves for directing a circulation fluid through the first thermal structure 32A.

In one embodiment, it is desired to heat the workpiece 22 and raise a workpiece temperature of the workpiece 22 so that the predetermined temperature differential 309 exists between the chuck 40 and the workpiece 22 before transferring the features to the workpiece.

With this embodiment, the first structure temperature controller 32C can direct and circulate a fluid through the first thermal structure 32A to achieve the predetermined, temperature differential. It should be noted that the first structure temperature controller 32C can include a temperature sensor 254 that provides feedback regarding the temperature of the first thermal structure 32A to the control system 24 for closed loop temperature control of the first thermal structure 32A.

Additionally, or alternatively, the lithography system 10 can include the second temperature controller 34 that adjusts the temperature of the chuck 40 to achieve the predetermined temperature differential 309. As provided above, the second temperature controller 34 can include the second thermal structure 34A that is sized, shaped and positioned to control the chuck temperature of the chuck 40. In one embodiment, the second thermal structure 34A is a disk shaped, is made of a material having a relatively good thermal conductivity, and includes a structure adjacent surface 234D and a structure opposed surface 234E that is opposite to the structure adjacent surface 234D. In this embodiment, the structure adjacent surface 232D is positioned adjacent to, and faces the opposed chuck surface 240B. Further, the structure adjacent surface 234D is positioned in close proximity to or in contact with the opposed chuck surface 240B.

As provided above, optionally, the second temperature controller 34 can include the second structure mover 34B that selectively moves the second thermal structure 34A relative to the chuck 40. For example, the second structure mover 34B can include one or more actuators that move the second thermal structure 34A along the X, Y and Z axes relative to the chuck 40 so that the second thermal structure 34A is positioned next to or in contact with the chuck 40. Additionally, the second structure mover 34B can include a position sensor 253 that monitors the position of the second thermal structure 34A and/or the chuck 40 for closed loop control of the second structure mover 34B.

Further, as provided above, the second temperature controller 34 can include the second structure temperature controller 34C that can control the temperature of the second thermal structure 34A. As a non-exclusive example, the second structure temperature controller 34C can direct and circulate a fluid through the second thermal structure 34A to obtain the predetermined, temperature differential between the workpiece 22 and the chuck 40. The second structure temperature controller 34C can include one or more reservoirs, pumps, coolers, heaters, and/or flow valves for directing a circulation fluid through the second thermal structure 34A.

Alternatively, for example, the second thermal structure 34A can be eliminated and the second structure temperature controller 34C can directly circulate the fluid through passages in or near the chuck 40.

In one embodiment, it is desired to cool the chuck 40 and lower a chuck temperature of the chuck 40 so that the predetermined temperature differential exists between the chuck 40 and the workpiece 22 before transferring the features to the workpiece 22.

With this embodiment, the second structure temperature controller 34C can direct and circulate a fluid through the second thermal structure 34A to achieve the predetermined, temperature differential.

It should be noted that the second structure temperature controller 34C can include a temperature sensor 255 that provides feedback regarding the temperature of the second thermal structure 34A to the control system 24 for closed loop temperature control of the second thermal structure 34A.

Figure 4:
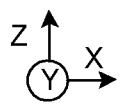
FIG. 4 is a simplified illustration of the workpiece, the chuck, and another embodiment of a temperature controller.
Figure 4:
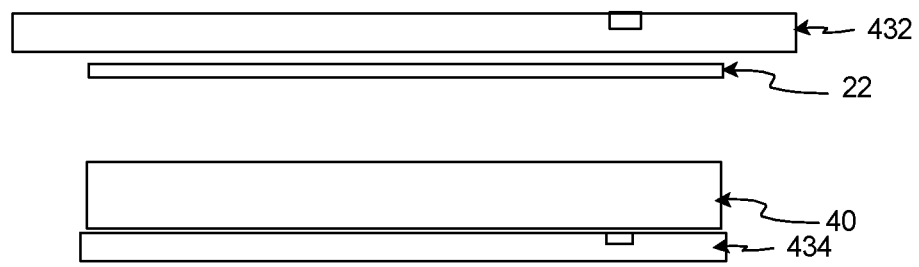

FIG. 4 is a simplified illustration of the workpiece 22, the chuck 40, and another embodiment of the temperature controller. In this embodiment, the temperature controller again includes a first temperature controller 432 that heats the workpiece 22 and a second temperature controller 434 that cools the chuck 40 to create the predetermined temperature differential prior to exposure. It should be noted that only a portion of each temperature controller 432, 434 is illustrated in FIG. 4. However, the design of these components can be similar to the temperature controllers 32, 34 described above and illustrated in FIG. 2. Additionally, one of the temperature controller 432, 434 may be optional.

In the embodiment illustrated in FIG. 4, (i) the temperature controllers 432, 434 are positioned in the environment 36 outside the chambers 26, 28, 30 (illustrated in FIG. 1), (ii) the first temperature controller 432 adjusts the workpiece temperature of the workpiece 22 prior to chucking; and (iii) the second temperature controller 434 adjusts the chuck temperature of the chuck 40 prior to chucking. Thus, the predetermined temperature differential is created while the workpiece 22 is spaced apart from the chuck 40.

It should be noted that one or more of the temperature controllers 32, 34 illustrated in FIG. 2 can be used in conjunction with one or more of the temperature controllers 432, 434 illustrated in FIG. 4 to create and/or maintain the predetermined temperature differential.

Figure 5:
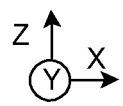
FIG. 5 is a simplified illustration of the workpiece, the chuck, and yet another embodiment of the temperature controller.
Figure 5:
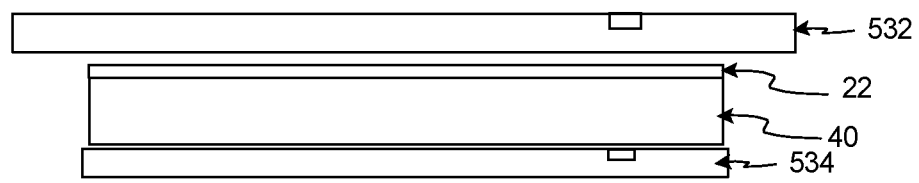

FIG. 5 is a simplified illustration of the workpiece 22, the chuck 40, and yet another embodiment of the temperature controller. In this embodiment, the temperature controller again includes a first temperature controller 532 that heats workpiece 22 and a second temperature controller 534 that cools the chuck 40 to create the predetermined temperature differential. It should be noted that only a portion of each temperature controller 532, 534 is illustrated in FIG. 5. However, the design of these components can be similar to the temperature controllers 32, 34 described above and illustrated in FIG. 2. Additionally, one of the temperature controller 532, 534 may be optional.

In the embodiment illustrated in FIG. 5, (i) the temperature controllers 532, 534 are positioned in the environment 36 outside the chambers 26, 28, 30 (illustrated in FIG. 1), (ii) the first temperature controller 532 adjusts the workpiece temperature of the workpiece 22 post chucking; and (iii) the second temperature controller 534 adjusts the chuck temperature of the chuck 40 post chucking. Thus, the predetermined temperature differential is created while the workpiece 22 is retained by the chuck 40.

It should be noted that one or more of the temperature controllers 32, 34 illustrated in FIG. 2 and/or one or more of the temperature controllers 432, 434 illustrated in FIG. 4 can be used in conjunction with one or more of the temperature controllers 532, 534 illustrated in FIG. 5 to create and/or maintain the predetermined temperature differential. To counteract the heat flow from the workpiece 22 to the chuck 40, it may be necessary to continuously supply heat to the workpiece 22 (e.g. with an infrared light source) and/or cool the chuck 40 (e.g. with a relatively cold fluid) so that the predetermined temperature differential exists at the start of exposure.

Thus, as provided herein, the problem of differential thermal expansion between the workpiece 22 and the chuck 40 leading to workpiece slip during an exposure process is solved by pre-heating the workpiece 22 and/or precooling the chuck 40 to the correct temperature difference prior to the exposure process.

Figure 6A:
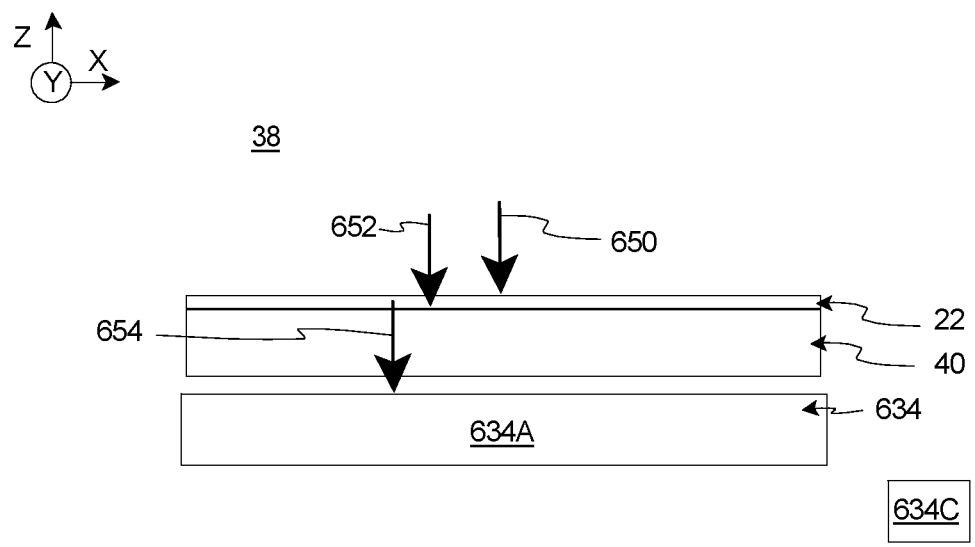
FIG. 6A is a simplified illustration of the workpiece, the chuck, and still another embodiment of a temperature controller.

FIG. 6A is a simplified schematic illustration of the workpiece 22, the chuck 40, and a chuck temperature controller 634. In this embodiment, the chuck temperature controller 634 is used to remove heat from the chuck 40 during the exposure of the workpiece 22 in the vacuum environment 38 of the processing chamber assembly 28 (illustrated in FIG. 1). FIG. 6A includes (i) a first arrow 650 that represents the exposure heat energy that is transferred to the workpiece 22 during exposure; (ii) a second arrow 652 that represents the workpiece heat energy that is transferred from the workpiece 22 to the chuck 40 by radiation and conduction heat transfer; and (iii) a third arrow 654 that represents the chuck heat energy that is transferred from the chuck 40 to the chuck temperature controller 634.

In FIG. 6A, the chuck temperature controller 634 includes (i) a thermal structure 634A that is positioned below, spaced apart from and preferably in close proximity to the chuck 40; and (ii) a structure temperature controller 634C that controls the temperature of the thermal structure 634A. The design of the thermal structure 634A and the structure temperature controller 634C, respectively, can be similar in design to the second thermal structure 34A and second structure temperature controller 34C described above and illustrated in FIG. 2. In FIG. 6A, the thermal structure 634A is spaced apart from the chuck 40. Thus, chuck heat energy 654 is transferred via radiation heat transfer from the chuck 40 to the thermal structure 634A.

In one embodiment, the thermal structure 634A is maintained at a cooler temperature than the chuck 40 to absorb the chuck heat energy 654 by radiation. Alternatively, the thermal structure 634A can be eliminated and the structure temperature controller 634C can directly control the temperature of the chuck 40. For example, the structure temperature controller 634C can direct a temperature controlled circulation fluid (not shown) directly through or near the chuck 40 to control the temperature of the chuck 40.

In one embodiment, the heat removal from the chuck 40 can be controlled to match the exposure power (exposure heat energy 650), which is known in advance. With this design, the flows of all of the heat energies 650, 652, 654 is the same, and the workpiece temperature of the workpiece 22 and the chuck temperature of the chuck 40 are maintained constant and are inhibited from raising. By maintaining the workpiece 22 and the chuck 40 temperature constant, with a fixed temperature difference between them, overlay performance can be improved. It should be noted that the exposure heat energy 650 may include sources of energy in addition to the pattern beam 44D (shown in FIG. 1). For example, the exposure heat energy 650 may include both energy from the photons or electrons of the pattern beam 44D and thermal energy radiated from portions of the projection lens assembly 18 that are at an elevated temperature.

It should be noted that in certain embodiments, during exposure, the chuck 40 can be moved relative to the thermal structure 634A, and/or the chuck 40 and the thermal structure 634A can be moved substantially concurrently.

Figure 6B:
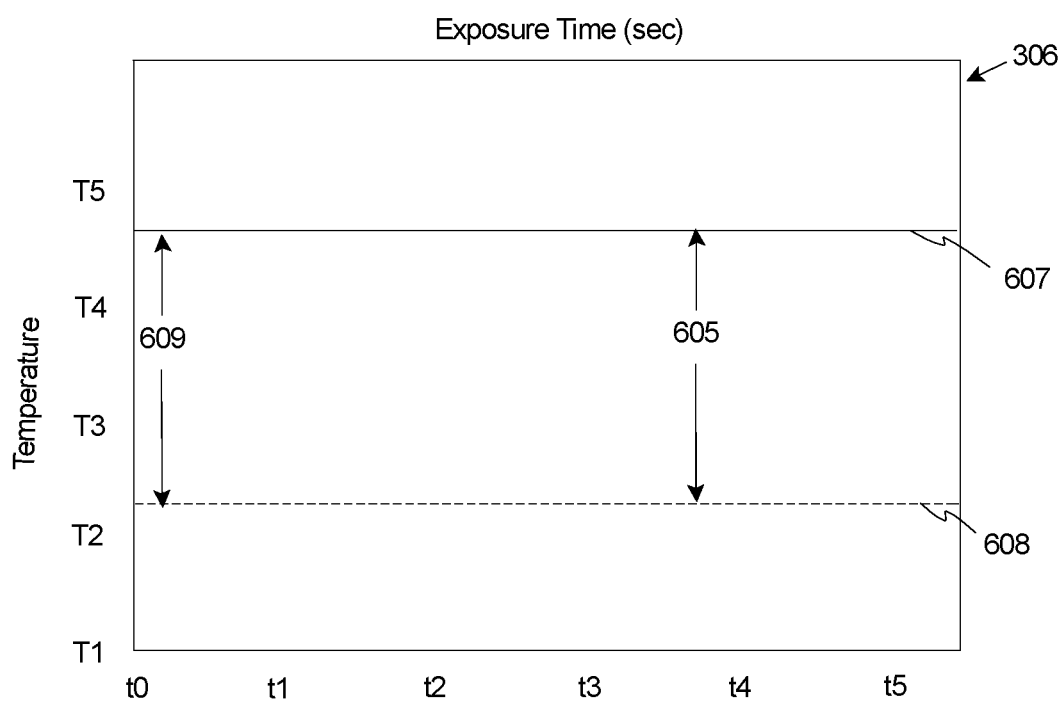
FIG. 6B is a graph that illustrates workpiece temperature and chuck temperature versus time.

FIG. 6B is a graph 606 that illustrates a first line 607 that illustrates how a workpiece temperature of the workpiece does not change during an exposure process, and a second line 608 that illustrates how a chuck temperature of the chuck also does not change during an exposure process when the predetermined, temperature differential 609 has been created prior to exposure and when the heat removal from the chuck 40 is controlled to match the exposure power. In this embodiment, the workpiece temperature 607 and the chuck temperature 608 each remain substantially constant (e.g. within 1, 2, 5, or 10 percent alternatively of the starting temperature) during the entire exposure. With this design, the position and orientation of alignment marks (not shown) on the workpiece can be measured at the beginning of the exposure process after the predetermined temperature differential 609 is achieved. Subsequently, during exposure, the workpiece temperature 607 and the chuck temperature 608 are maintained substantially constant. This will reduce the likelihood of workpiece slippage, and reduce the amount of workpiece deformation.

Figure 7:
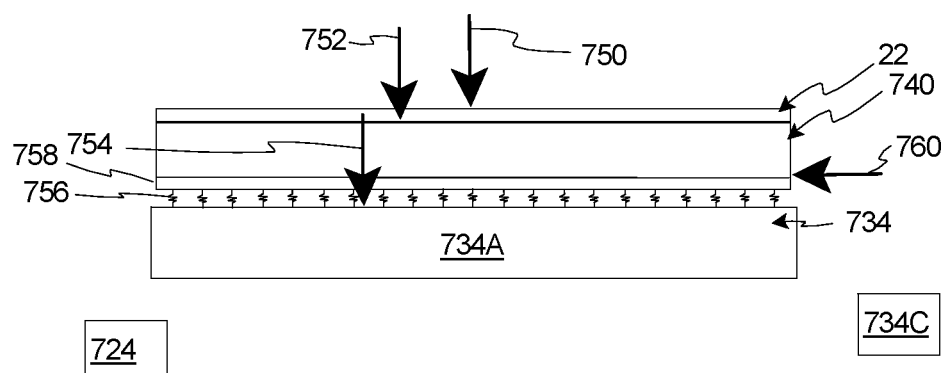
FIG. 7 is a simplified illustration of the workpiece, the chuck, and another embodiment of the temperature controller.

FIG. 7 is a simplified schematic illustration of the workpiece 22, another embodiment of the chuck 740, and yet another embodiment of a chuck temperature controller 734. In this embodiment, the chuck temperature controller 734 is again used to remove heat from the chuck 740 during the exposure of the workpiece 22 in the vacuum environment 38 of the processing chamber assembly 28 (illustrated in FIG. 1). FIG. 7 includes (i) a first arrow 750 that represents the exposure heat energy that is transferred to the workpiece 22 during exposure; (ii) a second arrow 752 that represents the workpiece heat energy that is transferred from the workpiece 22 to the chuck 740 by radiation and conduction heat transfer; and (iii) a third arrow 754 that represents the chuck heat energy that is transferred from the chuck 740 to the temperature controller 734. It should be noted that the exposure heat energy 750 is typically not fixed. In reality, the exposure heat energy 750 will depend on pattern density, dose, and other parameters that may change.

In FIG. 7, the chuck temperature controller 734 again includes (i) a thermal structure 734A (e.g. a cold plate) that is positioned below, spaced apart from, and preferably in close proximity to the chuck 740; and (ii) a structure temperature controller 734C that controls the temperature of the thermal structure 734A. The design of the thermal structure 734A and the structure temperature controller 734C, respectively, can be somewhat similar in design to the second thermal structure 34A and second structure temperature controller 34C described above and illustrated in FIG. 2. In FIG. 7, the thermal structure 734A is spaced apart from the chuck 740. Thus, chuck heat energy 754 is transferred via radiation heat transfer from the chuck 740 to the thermal structure 734A. In one embodiment, the thermal structure 734A is maintained at a cooler temperature than the chuck 740 to absorb the chuck heat energy 754 by radiation.

It should be noted that the embodiment illustrated in FIG. 7 is somewhat similar to the embodiment illustrated in Figure 6A, except, the chuck 740 and the thermal structure 734A are designed to have a known thermal resistance 756 (illustrated as small lightning bolts) therebetween, and the chuck 740 is designed to include a heater 758 to compensate for the variable exposure heat energy 750. As provided herein, by designing the chuck 740 and the thermal structure 734A to have known emissivity and surface area, the thermal resistance 756 between the chuck 740 and the thermal structure 734A is accurately known. For example, the materials utilized and the physical design of the chuck 740 and the thermal structure 734A can be varied and selected to achieve the desired thermal resistance 756.

As provided herein, the problem of minimizing temperature variations in the semiconductor workpiece 22 during a vacuum exposure process subject to predictable variations in the exposure power 750 is solved by placing a known thermal resistance 756 between the chuck 740 and the temperature controller 734 together with heater 758 in the chuck 740. As described in detail below, when the exposure power 750 varies, the power into heater 758 can be controlled to maintain a constant total heat flow (within 1, 2, 5, or 10 percent alternatively) into the chuck 740, and subsequently a constant heat transfer 754 (within 1, 2, 5, or 10 percent alternatively) into the thermal structure 734A. With this design, the steady state temperature of the workpiece 22 and chuck 740 can be consistently controlled to a known value, thereby ensuring predictable thermal expansion of the workpiece 22 and chuck 740, even as the exposure power 750 changes.

Because the exposure process is carried out under well controlled conditions, the exposure heat energy 750 that is being absorbed by the workpiece 22, and the workpiece heat energy 752 transferred to the workpiece 22 is well known and can vary in a known fashion. Subsequently, the steady state temperature of the workpiece 22 and chuck 740 that will provide an equal chuck heat energy 754 across the known resistance 756 into the thermal structure 734A can be calculated. With proper design, this steady state temperature can be held to an acceptable value. In certain embodiments, these calculations should assume the maximum expected exposure heat energy 750 into the workpiece 22 and the maximum expected workpiece heat energy 752 into the chuck 740, and the thermal structure 734A and the thermal resistance 758 can be designed to accommodate this load.

For exposure conditions where the heat flow into the workpiece 22 and chuck 740 will be smaller, the resistive heater 758 in the chuck 740 can be used to add heater energy 760 (illustrated as an arrow). With this design, the control system 724 can control the heater 758 so that the correct amount of additional heater energy 760 is added to the chuck 740 so that the total heat input is equal to the "worst case" exposure value used in the system design. For example, if the temperature control system 734 is designed for a maximum of five watts of exposure heat 740, under conditions where only four watts is incident on the workpiece 22, the heater 758 can be controlled to supply an additional one watt. Therefore, the total heat into the workpiece 22 and chuck 740 is still five watts total, so the steady state temperature is maintained at the designed value. Stated in another fashion, the heater 758 can be used to add heater energy 760 to the chuck 740 so that a constant heat load is added to the chuck 740 even as the exposure heat energy 750 (and the workpiece heat energy 752) varies due to different features being transferred to the workpiece 22.

As a result thereof, the heat removal from the chuck 740 can be controlled to match the exposure power (exposure heat energy 750) which is known in advance plus the variable heater power. With this design, the flows of all of the heat energies 750, 752, 754 are the same, and the workpiece temperature of the workpiece 22 and the chuck temperature of the chuck 740 are maintained constant and are inhibited from raising. By maintaining the workpiece 22 and the chuck 740 temperature constant, with a fixed temperature difference between them, overlay performance can be improved.

Stated in yet another fashion, in the embodiment illustrated in FIG. 7, the control system 724 can controls the heater 758 so that the heater energy 760 added to the chuck 740 plus the workpiece heat energy 752 that is transferred to the chuck 740 from the workpiece 22 during exposure is approximately equal to a chuck heat energy 754 that is transferred from the chuck 740 to the chuck temperature controller 734. As alternative, non-exclusive examples, "approximately equal" shall mean within 1, 2, 5 or 10 percent.

Figure 8:
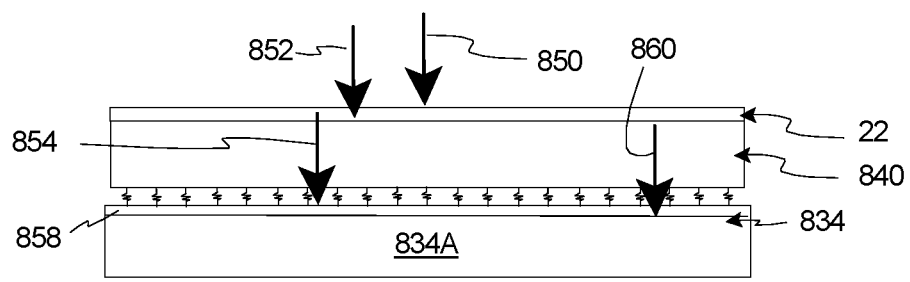
FIG. 8 is a simplified illustration of the workpiece, the chuck, and still another embodiment of the temperature controller.

FIG. 8 is a simplified schematic illustration of the workpiece 22, yet another embodiment of the chuck 840, and still another embodiment of a temperature controller 834. In FIG. 8, these components are similar to the corresponding components described above and illustrated in FIG. 7. However, in this embodiment, the heater 858 has been moved to the thermal structure 834A. With this design, the control system 824 can control the heater 858 to add heater energy 860, as needed, so that the total heat input is equal to the "worst case" value of the exposure heat energy 850 used in the system design. In the configuration illustrated in FIG. 8, fewer wires and/or hoses (not shown) may be needed on the precision stage or moving component.

Stated in yet another fashion, in the embodiment illustrated in FIG. 8, the control system 824 can controls the heater 858 so that the surface temperature of the temperature controller 834 is raised, and the heat transfer 854 is adjusted to be approximately equal to a workpiece heat energy 852 that is transferred to the chuck 840 from the workpiece 22 during exposure. As alternative, non-exclusive examples, "approximately equal" shall mean within 1, 2, 5 or 10 percent.

Figure 9A:
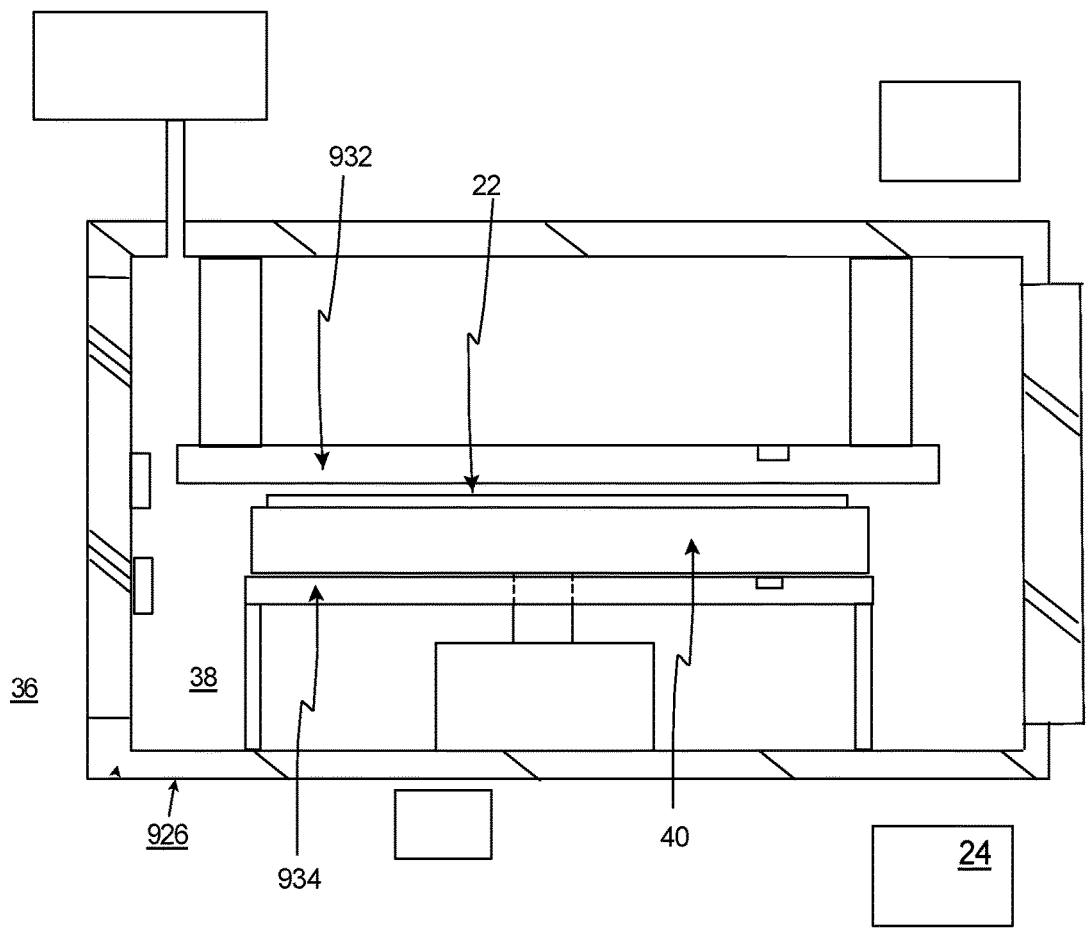
FIG. 9A is a simplified schematic illustration of a portion of another embodiment of a lithography system.

FIG. 9A is a simplified illustration of another embodiment of the transition chamber assembly 926 with the chuck 40 retaining the workpiece 22 positioned therein. In this embodiment, the first transition chamber assembly 926 again includes a first temperature controller 932 that adjusts the temperature of the workpiece 22 and/or the second temperature controller 934 adjusts the temperature of the chuck 40. The design of these components can be similar to the corresponding components described above and illustrated in FIG. 2. It should be noted that the transition chamber assembly 926 can be designed with only one or both of the temperature controllers 932, 934.

In FIG. 9A, the transition chamber assembly 926 is again used to transition the workpiece 22 from the first controlled environment 36 (e.g. atmospheric pressure) to the second controlled environment 38 (e.g. a vacuum). During this pressure change, the chuck 40 and the workpiece 22 will expand in volume due to the reduction in pressure. The amount of expansion is determined by their respective bulk modulus. Most likely, the material used for the workpiece 22 will be different from the material used for the chuck 40 and the bulk modulus of the workpiece 22 will be different from the bulk modulus of the chuck 40. This difference will lead to differential expansion during the pressure change, leading to the possibility of workpiece 22 slip or distortion.

Figure 9B:
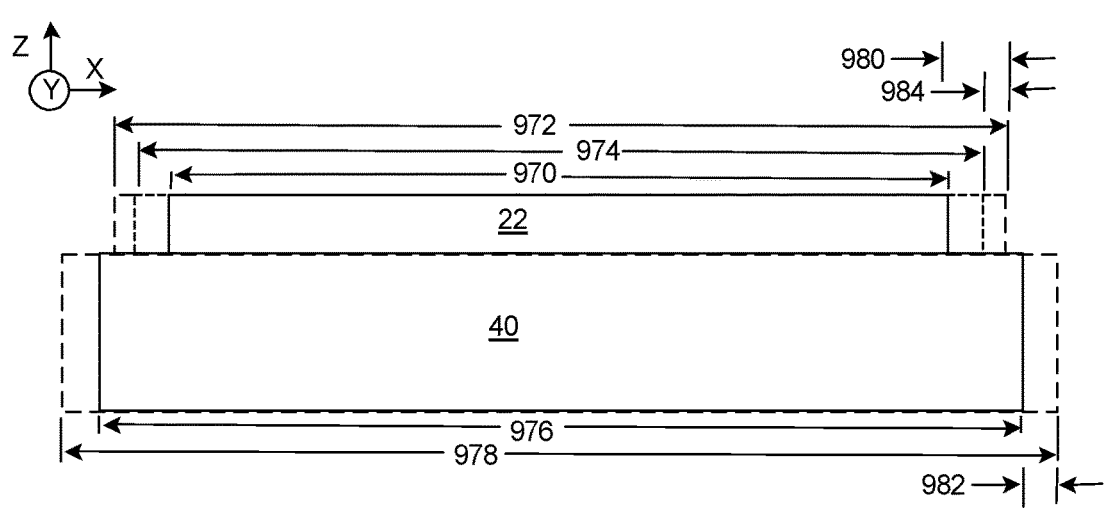
FIG. 9B is a simplified illustration of a workpiece and chuck from FIG. 9A.

FIG. 9B is a simplified illustration of the workpiece 22 and the chuck 44 at alternative environmental conditions. More specifically, FIG. 9B illustrates (i) the workpiece 22 in solid line when at the atmospheric pressure; (ii) the chuck 40 in solid line when at the atmospheric pressure; (iii) the workpiece 22 in long dashed line when at a reduced pressure; (iv) the chuck 40 in long dashed line when at the reduced pressure; and (v) the workpiece 22 in short dashed line at the reduced pressure while cooled.

In FIG. 9B, the workpiece 22 has (i) a first workpiece width 970 when at the first environmental condition, (ii) an expanded second workpiece width 972 when at the second environmental condition, (iii) an expanded third workpiece width 974 when at the second environmental condition and cooled. Somewhat similarly, the chuck 40 has (i) a first chuck width 976 when at the first environmental condition, and (ii) an expanded second chuck width 978 when at the second environmental condition. With reference to both FIGS. 9A and 9B, because the pressure in the second controlled environment 38 is less than the pressure in the first controlled environment, (i) the second workpiece width 972 is greater than the first workpiece width 970; and (ii) the second chuck width 978 is greater than the first chuck width 976. As provided herein, (i) the difference between the second workpiece width 972 and the first workpiece width 970 shall be referred to as the workpiece pressure change 980 (or "workpiece pressure expansion" when the second pressure is less than the first pressure); and (ii) the difference between the second chuck width 978 and the first chuck width 976 shall be referred to as the chuck pressure change 982 (or "chuck pressure expansion" when the second pressure is less than the first pressure). It should be noted that the pressure changes 980, 982 are only illustrated on one side.

In one embodiment, the workpiece bulk modulus is less than the chuck bulk modulus. As a result thereof, the workpiece pressure expansion 980 is greater than the chuck pressure expansion 982. In this embodiment, the control system 24 can control the first temperature controller 932 to cool the workpiece 22 to compensate for the workpiece pressure expansion 980 being greater than the chuck pressure expansion 982. For example, the temperature controller 932 can chill the workpiece 22 so that a workpiece thermal change 984 (e.g. contraction) of the workpiece 22 plus the workpiece pressure expansion 980 is approximately equal to the chuck pressure expansion 982.

For example, the workpiece 22 can be a silicon wafer having a bulk modulus K=98.5 GPa, and the chuck 44 can be made of silicon carbide (SiC) having a bulk modulus of K=191 GPa. In this example, for a one atmosphere change in ambient pressure, the chuck 44 will expand linearly in each direction by 0.18 parts per million ("ppm") and the workpiece 22 will expand by 0.34 ppm. In modern lithography applications, it is needed to maintain accuracy on the order of 0.003 ppm (1 nanometer across a 300 mm wafer). If the workpiece 22 grows by a larger amount than the chuck 40, there may be problems of workpiece slip or unpredictable distortion changes.

In one non-exclusive example, the silicon used for the workpiece 22 can have a coefficient of thermal expansion (CTE) approximately 3.4 ppm/K. During the air to vacuum transition, if the workpiece temperature is lowered by 47 mK, the workpiece 22 would be expected to contract linearly by 0.16 ppm. This contraction is precisely the amount needed to make the net change in the wafer volume 0.34 ppm-0.16 ppm equal to the pressure-induced change in the SiC chuck 944 (0.18 ppm). Therefore workpiece 22 slip, microslip, and wafer distortion changes can be avoided.

Alternatively, or additionally, the temperature controller 934 can be used to heat the chuck 40 to compensate for the workpiece pressure expansion 980 being greater than the chuck pressure expansion 984. For example, the temperature controller 934 can heat the chuck 40 so that a chuck thermal expansion of the chuck 40 plus the chuck pressure expansion 982 is approximately equal (e.g. within 1, 2, 5 or 10 percent, alternatively) to the workpiece pressure expansion 980.

In another, non-exclusive example, the silicone used for the workpiece 22 can have a coefficient of thermal expansion (CTE) approximately 2.6 ppm/K. In this example, the temperature of the workpiece 22 and/or the chuck 40 can be adjusted appropriately to that the overall chuck expansion is approximately equal (e.g. within 1, 2, 5 or 10 percent, alternatively) to the overall workpiece expansion.

In yet another embodiment, the workpiece bulk modulus is greater (higher) than the chuck bulk modulus. As a result thereof, the workpiece pressure expansion 980 is less than the chuck pressure expansion 982. In this embodiment, the control system 24 can control the first temperature controller 932 to heat the workpiece 22 to compensate for the workpiece pressure expansion 980 being less than the chuck pressure expansion 982. For example, the temperature controller 932 can heat the workpiece 22 so that a workpiece thermal change 984 (e.g. expansion) of the workpiece 22 plus the workpiece pressure expansion 980 is approximately equal to the chuck pressure expansion 982. In this example, alternatively, or additionally, the temperature controller 934 can be used to cool the chuck 40 to compensate for the workpiece pressure expansion 980 being less than the chuck pressure expansion 984. For example, the temperature controller 934 can cool the chuck 40 so that a chuck thermal contraction of the chuck 40 plus the chuck pressure expansion 982 is approximately equal (e.g. within 1, 2, 5 or 10 percent, alternatively) to the workpiece pressure expansion 980.

With the present invention, the problem of differential expansion between the workpiece 22 and the chuck 40 during a change in ambient pressure (e.g., a transition from atmospheric pressure to vacuum) is solved by simultaneously controlling the workpiece temperature and/or the chuck temperature so thermal expansion/contraction of the workpiece 22 offsets (e.g. within 1, 2, 5 or 10 percent, alternatively) the difference in the bulk moduli of the workpiece and chuck materials.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 10A:
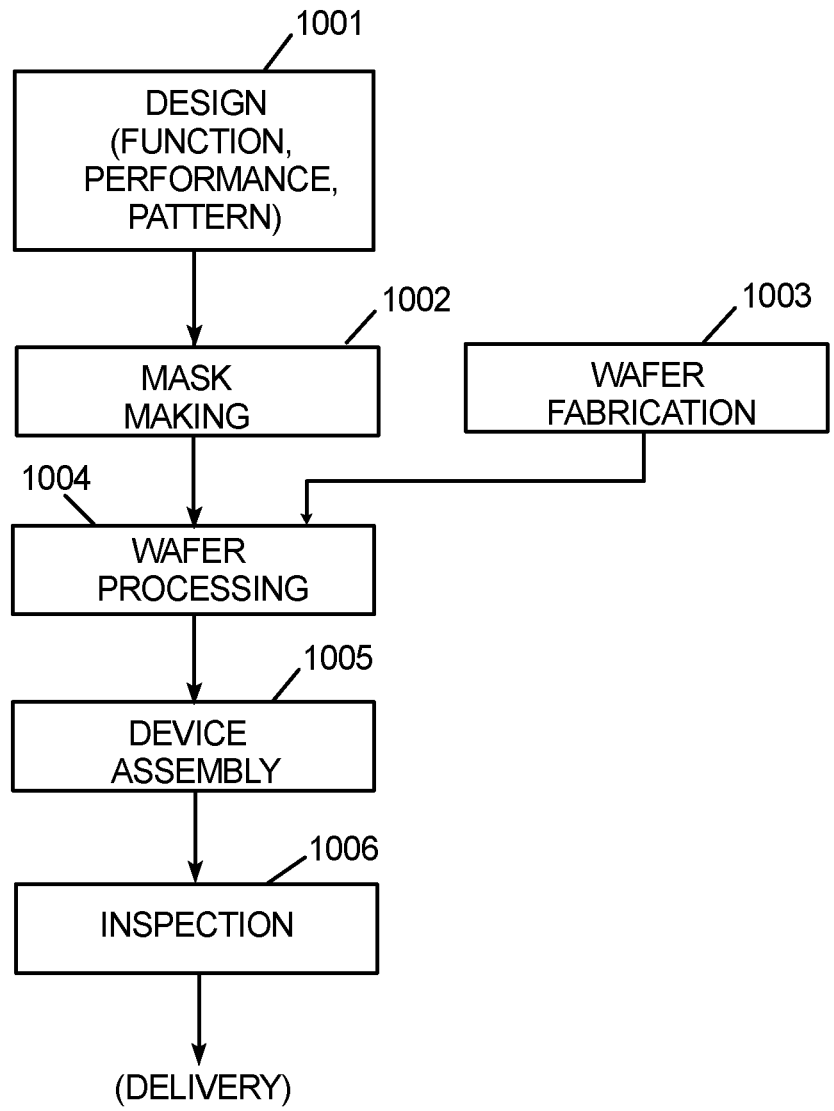
FIG. 10A is a flow chart that outlines a process for manufacturing a device in accordance with the present invention.

Further, semiconductor devices can be fabricated using the above described systems, by the process shown generally in FIG. 10A. In step 1001 the device's function and performance characteristics are designed. Next, in step 1002, a mask (reticle) having a pattern is designed according to the previous designing step, and in a parallel step 1003 a workpiece is made from a silicon material. The mask pattern designed in step 1002 is exposed onto the workpiece from step 1003 in step 1004 by a photolithography system described hereinabove in accordance with the present invention. In step 1005 the semiconductor device is assembled (including the dicing process, bonding process and packaging process), finally, the device is then inspected in step 1006.

Figure 10B:
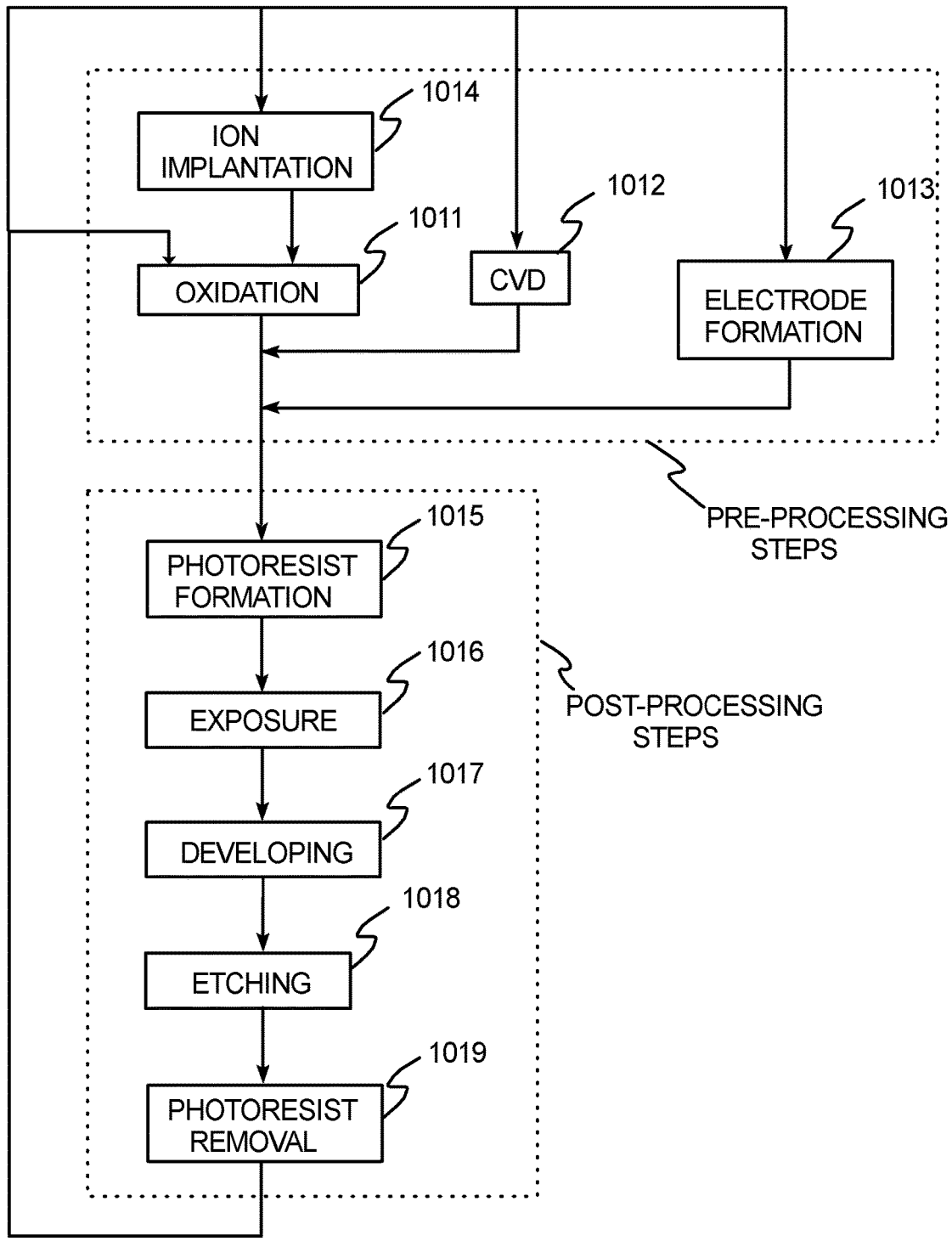
FIG. 10B is a flow chart that outlines the device processing in more detail.

FIG. 10B illustrates a detailed flowchart example of the above-mentioned step 1004 in the case of fabricating semiconductor devices. In FIG. 10B, in step 1011 (oxidation step), the workpiece surface is oxidized. In step 1012 (CVD step), an insulation film is formed on the workpiece surface. In step 1013 (electrode formation step), electrodes are formed on the workpiece by vapor deposition. In step 1014 (ion implantation step), ions are implanted in the workpiece. The above mentioned steps 1011-1014 form the preprocessing steps for workpieces during workpiece processing, and selection is made at each step according to processing requirements.

At each stage of workpiece processing, when the above-mentioned preprocessing steps have been completed, the following post-processing steps are implemented. During post-processing, first, in step 1015 (photoresist formation step), photoresist is applied to a workpiece. Next, in step 1016 (exposure step), the above-mentioned exposure device is used to transfer the circuit pattern of a mask (reticle) to a workpiece. Then in step 1017 (developing step), the exposed workpiece is developed, and in step 1018 (etching step), parts other than residual photoresist (exposed material surface) are removed by etching. In step 1019 (photoresist removal step), unnecessary photoresist remaining after etching is removed.

While a number of exemplary aspects and embodiments of the present invention have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. An exposure apparatus comprising:
a chuck that retains a workpiece to be exposed with a beam;
a chamber in which the chuck is arranged; and
a temperature controller that adjusts the temperature of at least one of the chuck and the workpiece retained by the chuck while the workpiece is retained by the chuck so that a temperature differential exists between the chuck and the workpiece, and wherein the temperature differential exists before the workpiece is exposed with the beam.

2. The exposure apparatus of claim 1 wherein the temperature controller adjusts the temperature of at least one of the chuck and the workpiece so that the temperature differential is substantially equal to an equilibrium temperature difference that will drive enough heat across a thermal contact resistance at an interface between the workpiece and the chuck to balance an incoming exposure power from the beam.

3. The exposure apparatus of claim 1 wherein the temperature controller adjusts the temperature of at least one of the chuck and the workpiece so that the temperature differential is sufficient so that heat flow into and out of the workpiece is substantially balanced while the workpiece is exposed with the beam.

4. The exposure apparatus of claim 1 wherein the temperature controller adjusts the temperature of at least one of the chuck and the workpiece so that the workpiece is hotter than the chuck.

5. The exposure apparatus of claim 4 wherein the temperature controller heats the workpiece so that a workpiece temperature is higher than a chuck temperature of the chuck.

6. The exposure apparatus of claim 1 wherein the temperature controller adjusts the temperature of at least one of the chuck and the workpiece so that the temperature differential is at least approximately 5 milli-Kelvin.

7. The exposure apparatus of claim 1 wherein the temperature controller includes a thermal structure and a structure temperature controller that controls the temperature of the thermal structure.

8. The exposure apparatus of claim 7 wherein the thermal structure is a cold-plate placed in proximity to the chuck so that heat is transferred from the chuck to the thermal structure by radiation.

9. The exposure apparatus of claim 1 further comprising a chuck temperature controller that controls the temperature of the chuck while the workpiece is exposed with the beam.

10. The exposure apparatus of claim 9 further comprising a heater that is secured to one of the chuck and the chuck temperature controller, wherein the heater is selectively controlled by a control system to compensate for variations in the beam.

11. The exposure apparatus of claim 1 wherein the beam comprises EUV radiation of wavelength 13.5 nm or shorter.

12. The exposure apparatus of claim 1 wherein the beam comprises at least one electron beam.

13. An exposure apparatus comprising:
a chuck that retains a workpiece to be exposed with a beam;
a chamber that encircles the chuck and the workpiece;
a pre-temperature controller that adjusts the temperature of at least one of the chuck and the workpiece so that a temperature differential exists between the chuck and the workpiece before the workpiece is exposed with the beam;
a chuck temperature controller that controls the temperature of the chuck while the workpiece is exposed with the beam so that the temperature differential between the chuck and the workpiece is substantially maintained during the exposure process;
a heater that is secured to one of the chuck and the chuck temperature controller; and
a control system that controls the heater to compensate for variations in the beam.

14. The exposure apparatus of claim 13 wherein the heater is secured to the chuck.

15. The exposure apparatus of claim 13 wherein the heater is secured to the chuck temperature controller.

16. The exposure apparatus of claim 13 wherein the chuck and the chuck temperature controller are designed to have a known thermal resistance therebetween.

17. The exposure apparatus of claim 13, wherein the control system controls the heater to add a heater energy to the chuck; wherein the control system controls the heater so that the heater energy plus a workpiece heat energy that is transferred to the chuck from the workpiece during exposure is approximately equal to a chuck heat energy that is transferred from the chuck to the chuck temperature controller.

18. The exposure apparatus of claim 17 wherein the heater energy is adjusted by the control system to compensate for changes in the workpiece heat energy so that the heat transfer from the chuck to the chuck temperature controller is substantially constant.

19. The exposure apparatus of claim 13, wherein the control system controls the heater to add a heater energy to the chuck temperature controller; wherein the control system controls the heater so that the heat transfer from the chuck to the chuck temperature controller is approximately equal to a workpiece heat energy that is transferred to the chuck from the workpiece during exposure.

20. The exposure apparatus of claim 13 wherein the beam comprises EUV radiation of wavelength 13.5 nm or shorter.

21. The exposure apparatus of claim 13 wherein the beam comprises at least one electron beam.

22. The exposure apparatus of claim 1 wherein the chamber encircles the chuck and the workpiece.

23. The exposure apparatus of claim 1 wherein the temperature differential between the chuck and the workpiece is substantially maintained during the exposure process.

24. The exposure apparatus of claim 13 wherein the pre-temperature controller adjusts the temperature of the at least one of the chuck and the workpiece while the workpiece is retained by the chuck so that the temperature differential exists between the chuck and the workpiece before the workpiece is exposed with the beam.

* * * * *